June 14, 1960 N. B. BLAKE ET AL 2,941,160
OSCILLATOR
Filed March 29, 1957
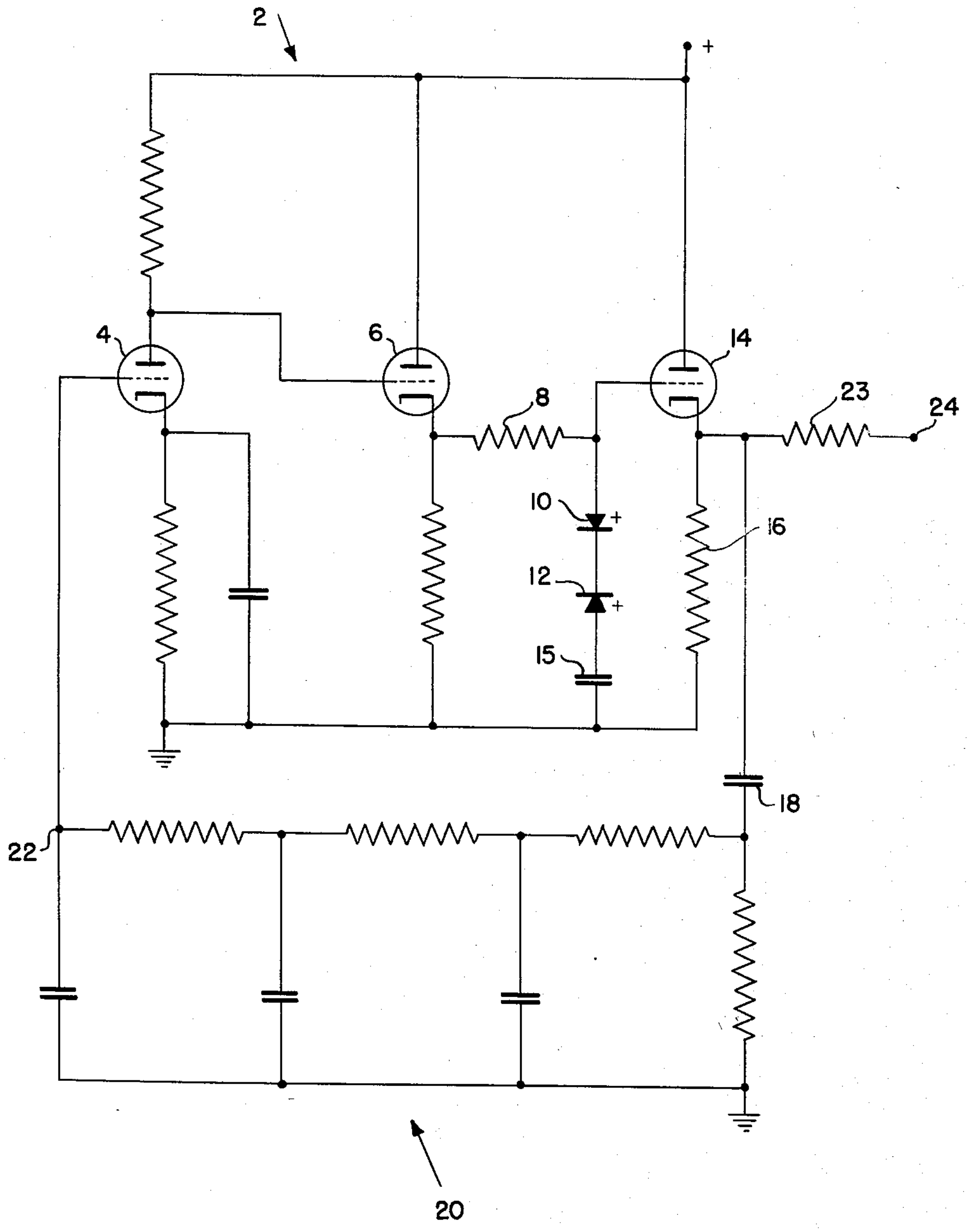
INVENTORS
NORMAN B. BLAKE &
WILLIAM E. HOLTKAMP, Jr.
BY
Busser, Smith & Harding
ATTORNEYS 2,941,160

OSCILLATOR

Norman B. Blake and William E. Holtkamp, Jr., Beaumont, Tex., assignors to Sun Oil Company, Philadelphia, Pa., a corporation of New Jersey Filed Mar. 29, 1957, Ser. No. 649,489

4 Claims. (Cl. 331—137)

This invention relates to an oscillator of the phase shift type which has special advantages from the standpoint of stability, magnitude of output produced consistent with simplicity, etc.

The objects of the invention will become apparent from the following description read in conjunction with the accompanying drawing in which the figure is a wiring diagram of the oscillator.

The oscillator has been found particularly useful in seismic prospecting apparatus and is disclosed in such use in our application, Serial Number 649,485, filed March 29, 1957; but it is of more general applicability and is claimed per se herein.

There is indicated generally at 2 an oscillator which is particularly advantageous in the production of a carrier which may typically have a frequency of 600 cycles per second in seismic work. This frequency is by no means critical and may be widely varied depending upon the results desired. The oscillator comprises a triode 4 associated with an anode load resistor and providing an amplified output through a direct conductive connection to the grid of a triode 6 connected in a cathode follower arrangement. The output from the cathode of triode 6 is delivered through a resistor 8 to an arrangement of diodes 10 and 12 arranged oppositely in series and connected through a large capacitor 15 to ground. These diodes are of a known reference type which have the property of breaking down when the reverse potential across them exceeds a definite value such as 3½ volts for each diode. The ungrounded end of this diode arrangement is connected to the control grid of triode 14 which is arranged in a cathode follower circuit with a cathode resistor 16. The output of this cathode follower is delivered through capacitor 18 to a phase shift lag line constituting a low pass filter which filters out essentially everything but a fundamental wave and accordingly provides an output from a terminal 22 to the grid of amplifier triode 4 which is substantially a pure sine wave. The frequency of oscillation is determined by that frequency which through the phase shift line 20 provides a 180° phase shift. The number of sections of the line 20 may be increased to provide additional filtering action to secure as nearly a pure sine wave output as may be desired.

The oscillator just described has considerable advantage over other oscillators. The usual phase shift oscillator is barely on the point of oscillation whereas the present oscillator may have violent oscillations with maintenance of a substantially constant output and feed back irrespective of the gain of the amplifier stage involving triode 4. This results from the fact that the diodes 10 and 12 limit the peak-to-peak signal appearing at the grid of the cathode follower triode 14. For example, if each of the diodes 10 and 12 breaks down at 3½ volts, the peak-to-peak amplitude at the grid of triode 14 will be approximately seven volts irrespective of the gain of the amplifier. The capacitor 15, of course, acquires a positive potential, due to its connection to the cathode resistor of the conducting triode 6. A substantially pure sine wave input to the triode 4 gives a sine wave output therefrom, with small distortion, greatly in excess of the peak-to-peak signal appearing at triode 14. The result is that at the cathode of triode 14 there appears (superposed on a constant D.C. base) a square wave of substantially constant amplitude differing from an exact square wave by being somewhat rounded. The feed-back through the line 20 removes from this square wave its harmonic components to deliver a substantially pure fundamental since wave to the tube 4. Substantially constant frequency is maintained since the oscillations occur at that frequency which has a 180° phase shift through the passive network 20. If adjustability of frequency is desired, the resistors and/or capacitors of the net work may be made variable. Conventional network theory gives the resistance and capacity relationships which for a given frequency results in the 180° phase shift and optimum filter action, and hence that need not be detailed herein.

An output in the form of a substantially pure sine wave of constant amplitude may be taken from the anode of triode 4 or from the cathode of triode 6. Alternatively an approximately square wave of substantially constant amplitude may be taken from the cathode of triode 14 through the resistor 23 and terminal 24. If required, and as described in our application referred to above, this square wave may be subjected to limiting and then utilized for any desired purpose.

From the above it will be evident that there is provided a stable oscillator of the phase shift type capable of delivering large outputs but nevertheless stable and of adjustably predetermined frequency.

What is claimed is:

1. An oscillator comprising an amplifier having input and output terminals, signal amplitude limiting means connected to said output terminal, said limiting means comprising a series arrangement of oppositely polarized diodes, each of a type which breaks down at a predetermined reverse potential, thereby to provide an approximately constant amplitude square wave at said terminal having an amplitude substantially less than the signal amplitude produced by said amplifier, a network of low pass type, means connecting said output terminal to the input of said network, and means connecting the output of said network to said input terminal.

2. An oscillator according to claim 1 in which said network is of a type producing a 180° phase shift at the oscillation frequency of the oscillator.

3. An oscillator according to claim 1 in which said network is of resistance-capacitance type.

4. An oscillator according to claim 2 in which said network is of resistance-capacitance type.

References Cited in the file of this patent

UNITED STATES PATENTS

| | | |
|---|---|---|
| 2,446,106 | Robertson | July 27, 1948 |
| 2,505,980 | Mautner | May 2, 1950 |
| 2,581,273 | Miller | Jan. 1, 1952 |
| 2,704,330 | Marker | Mar. 15, 1955 |
| 2,854,651 | Kircher | Sept. 30, 1958 |

OTHER REFERENCES

"Negative Resistance in Germanium Diodes," by Kauke, in Radio-Electronic Engineering, pp. 8–10, April 1953.